United States Patent [19]

Bourrieres

[11] Patent Number: 4,884,738
[45] Date of Patent: Dec. 5, 1989

[54] METHOD AND APPARATUS FOR BRAZING SURFACE COMPONENTS ONTO A PRINTED CIRCUIT BOARD

[76] Inventor: Francis Bourrieres, Le Carreyat, 82000 Montauban, France

[21] Appl. No.: 275,419

[22] Filed: Nov. 23, 1988

Related U.S. Application Data

[63] Continuation-in-part of Ser. No. 42,652, Apr. 28, 1987, abandoned.

[30] Foreign Application Priority Data

Apr. 28, 1986 [FR] France ................................. 8606236

[51] Int. Cl.[4] ........................ B23K 1/00; B23K 31/02; H05K 3/34
[52] U.S. Cl. ................................ 228/180.2; 228/201; 228/248; 228/20
[58] Field of Search ...................... 228/180.2, 248, 201, 228/20, 37, 43, 227

[56] References Cited

U.S. PATENT DOCUMENTS

| | | | |
|---|---|---|---|
| 3,500,536 | 3/1970 | Goldschmied | 228/37 |
| 4,363,434 | 12/1982 | Flury | 228/37 |
| 4,396,140 | 8/1983 | Jaffe et al. | 228/180.2 |
| 4,515,304 | 5/1985 | Berger | 228/180.2 |

Primary Examiner—Nicholas P. Godici
Assistant Examiner—Samuel M. Heinrich
Attorney, Agent, or Firm—Young & Thompson

[57] ABSTRACT

The brazing process for surface components on a circuit board involves brazing at the end of which microballs of different sizes are formed and dispersed in a random fashion on the board. The process is characterized in that the board is treated to decontaminate the surfaces of the board and the microballs to eliminate microballs formed during brazing, thereby leaving only the forces of surface tension. A superfusing liquid is placed in contact with the board under the following conditions:

the surface of the board carrying the contact components is directed downwardly, the temperature of the liquid is higher than that of the melting point of the brazing alloy constituting the brazes and the microballs to be eliminated, the contact time is adjusted to totally melt the microballs and superficially melt the brazes and the conductors given that the ratio of exposed surface to volume of the microballs is much greater than that of the brazes, and the superfusing liquid should not have any resultant of force parallel to the surface of the board sufficient to displace the contact components once these brazes are superficially melted.

6 Claims, 1 Drawing Sheet

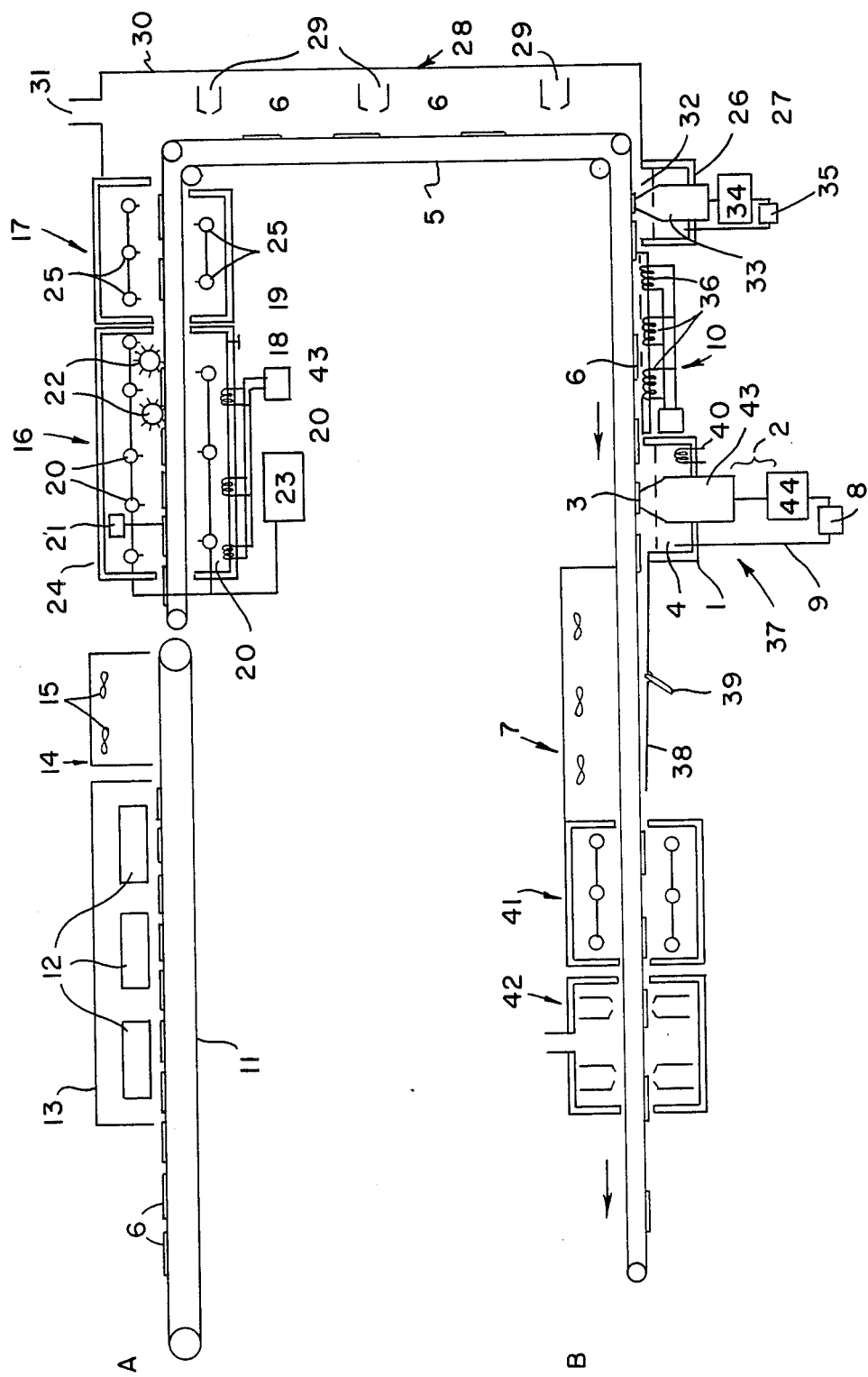

METHOD AND APPARATUS FOR BRAZING SURFACE COMPONENTS ONTO A PRINTED CIRCUIT BOARD

This application is a continuation-in-part of application Ser. No. 07/042,652 filed Apr. 28, 1987 now abandoned.

BACKGROUND OF THE INVENTION

The present invention relates to a method and apparatus for brazing, and particularly the brazing of surface components onto a printed substrate such as a circuit board.

The difference between a conventional through-component and a surface component lies in the manner of securing each of these components to the printed circuit board.

The through-component has tongues or prongs which pass through the circuit board in the desired positions, and are fixed therein by brazing, such as for example, by single or double waves of a melted brazing alloy.

The surface component is secured on the surface of the circuit board by another type of brazing, this being effected by means of a brazing paste constituted by microballs of brazing alloy and secured by a flux giving a pasty texture. The brazing cream is conventionally applied on the circuit board by serigraphy, or by other known processes, thereby forming contact points with the surface components. The surface components are oppositely arranged, and the temperature of the circuit board is raised to a temperature higher than the melting temperature of the brazing alloy.

The post-brazing problems of through and surface components are different. With regard to brazing the through-components, there must be an undesirable excess amount of brazing compound or an excess amount of gaseous bubbles contained in the brazes, which can be remedied either by application of a hot jet of fluid (either gas or liquid) first to melt and then to dispel the excess brazing compound, or by melting the brazes to permit the gas bubbles to escape. With regard to brazing surface components with the aid of a brazing cream, there must be a multitude of microballs dispersed in a random fashion on the circuit board. These microballs are of different sizes and originate from the brazing alloy constituting the microballs of the brazing cream The practical solutions for overcoming these problems of post-brazing the through-components are not effective to make the microballs disappear. That is, the application of a hot jet of fluid on the circuit board, first to melt the microballs and then to dispel them from the card, results in the simultaneous melting of the brazes and the displacement or ejection of the surface components themselves.

Remelting of these microballs without the application of mechanical force, as in the case of a jet of hot fluid, can neither eject them from the card nor integrate them to the metallic portions (lines and spaces for reception) of the circuit of the circuit board. The reason why a remelted microball in contact with a metallic surface cannot integrate itself with the metallic surface is the same reason why this same microball is not able to integrate itself to the metallic surface during brazing. That is, the metallic surface and/or the microball is contaminated. This contamination results from the fact that the surface of the microball and/or the metallic surface contain or carry a material, for example, an oxide or denatured flux, which prevents these melted microballs from spreading onto the metallic surface even though melted. Thus, the natural tendency of a melted metallic microball located on a metallic surface, whether melted or not, is to spread out on the surface to integrate therewith, thereby minimizing the exposed surface of the ensemble. The contamination of one or both surfaces prevents this reunion.

It should be noted that the conductors are often covered by a metallic alloy comparable to the brazing alloy from a standpoint of its composition and melting temperature. A metallic surface on a circuit board may be either a conductor or a reception site or any part of the component.

SUMMARY OF THE INVENTION

The present invention relates to brazing with the aid of a brazing paste constituted of microballs joined by a flux giving it a pasty form. These microballs constitute the alloy to be brazed, and they may have a composition, for example of tin, lead, and if desired other metals in conventionally employed amounts. The flux assures the association of the microballs, and in a known manner prepares the surfaces to be united.

At the present time, the tendency to use this brazing paste is increasing. This is due to the ease of its application ordinarily effected by serigraphy and also to the ease of the control of the thickness of the deposited layer. The disadvantage of this brazing technique is the formation of microballs dispersed in a random manner on the substrate. These dispersed microballs are often not those forming a part of the brazing cream. For example, they can be fragments emanating from splashing of the melted brazing alloy which occurs during brazing. These microballs may, according to their size and their position on the printed substrate, establish short circuits between the various connections or have other undesired effects as for example capacitative effects.

Generally speaking, it can be admitted that the difference in melting point between the flux and the alloy to be brazed in the form of microballs, may result in melting, if not boiling, of the flux before or during melting of the microballs. The thermally agitated, interstitial flux may, in attempting to escape, entrain fragments of the melted or unmelted metallic material, thus forming the microballs which are very troublesome at present.

These splashes of the metallic material, whether melted or not, can fall either onto a non-metallic surface or onto a metallic surface of the circuit board.

It is to be noted that during brazing, the circuit board is arranged with its surface bearing the surface components directed upwardly. Toward the end of brazing, the splashes of metallic material forming the microballs are melted and are located either on a non-metallic surface or on a metallic surface (such as welds, conductors, etc.) whether melted or not. A microball located on a non-metallic surface will remain bowled up on itself and attached to the non-metallic surface once the circuit board is cooled. A melted microball located on a metallic surface whether melted or not cannot integrate itself with the surface if the surface and/or the surface of the microball is contaminated.

Experiments are known at present which seek to control the spatterings or splashes of the metallic material, by regulating the rise in temperature. These experiments have shown that a slow rise in temperature, that is to say, spread out over time, up to the melting point of the metallic alloy permits the flux to escape in a less agitated state.

The disadvantages of this technique are the ongoing possibility of the formation of microballs in relatively lesser quantities and the slowness of the brazing process.

For these reasons, and so as to overcome the disadvantages described above, the present invention proposes a process and apparatus for brazing surface components onto a circuit board. According to the process forming part of the invention and according to one embodiment, the brazing paste is distributed, for example by serigraphy, on the places where the brazing is to be effected, the surface components are manually or automatically positioned on the substrate, its temperature is elevated up to a temperature higher than the melting point of the alloy to be brazed, and finally this substrate is cooled to permit solidification of the brazing as a result of which the microballs of different sizes are formed and dispersed in a random manner on the circuit board on the metallic and non-metallic surfaces. The process is characterized essentially in that the substrate is, so as to eliminate these microballs formed during brazing, treated to decontaminate its surface and the surfaces of these microballs, thereby leaving only the forces of surface tension of these surfaces to ct and place them in contact with a superfusing liquid under the following conditions:

the surface of the board bearing the contact components is downwardly directed;

the temperature of the liquid is higher than that of the melting point of the brazing alloy constituting the brazes and the microballs to be eliminated;

the time of contact is adjusted so as to totally melt the microballs and superficially melt the brazes and the conductors, given that the ratio of exposed surface to the volume of the microballs is much greater than that of the brazes; and the superfusing liquid should not have a resultant of force parallel to the surface of the circuit board sufficient to displace the contact components once the brazes are superficially melted.

According to a particular embodiment of the present method, the decontamination of the surface of the circuit board and that of the microballs and the total refusion of the microballs and the superficial refusion of the brazes are simultaneously effectuated by incorporating a decontaminating product in the superfusing liquid.

According to another embodiment, the apparatus for practicing the process is characterized by a transport assembly which advances either continuously or discontinuously to present the brazed surfaces of the circuit board downwardly and by two post-brazing compartments. One compartment is provided for decontamination by application of liquid flux to the surfaces of the circuit boards to be treated. Another compartment is provided for melting with the aid of a readily fusible liquid heated to a temperature higher than that of the brazing alloy.

BRIEF DESCRIPTION OF THE FIGURE

The present invention will be best understood from a reading of the following detailed description, taken in conjunction with the drawing schematically showing the apparatus for practicing the process.

DETAILED DESCRIPTION

As was previously stated, brazing of surface components with the aid of brazing paste, onto a printed substrate such as a circuit board offers several advantages. On the other hand, the formation of microballs, always present during brazing, presents a serious disadvantage for obtaining a final product of good quality. This results in the rejection of a greater or lesser percentage of finished printed substrates, particularly for those bearing components with multiple, closely spaced contacts.

According to the process forming part of the present invention, the brazing itself is first effected with the aid of any known means: the brazing paste is first applied on the mounting locations of the surface components, the components are positioned, the temperature is elevated up to the melting point of the alloy to be brazed contained in the paste in the form of microballs, and finally the printed substrate is cooled so as to permit solidification of the brazes. In order to eliminate the microballs formed during brazing, the printed substrate thus produced is thereafter treated to decontaminate the surface of the board and the surfaces of the microballs, thus leaving only the forces of surface tension of these surfaces to act and place in contact with a superfusing liquid observing the following conditions:

the surface of the board carrying the contact components is directed downwardly;

the temperature of the liquid is higher than the melting temperature of the brazing alloy constituting the brazes and the microballs to be eliminated;

the time of contact is adjusted to totally melt the microballs and superficially melt the brazes given that the ratio of exposed surface to volume of the microballs is much greater than that of the brazes; and the readily fusible liquid should not possess a resultant of force parallel to the surface of the board sufficient to displace the contact components once the brazes are superficially melted.

The period during which the substrate is contacted with the superfusing liquid must be sufficient to cause the total melting of the microballs, but on the other hand it must not be so long as to deeply melt the seams or brazes themselves. Specifically, the formed microballs generally have a volume much greater than that of the seams themselves, which means that the microballs have an exposed surface relative to their volume much less than that of the seams themselves. It will therefore be readily understood that by contacting the circuit board with a superfusing liquid, these microballs, of which the ratio of exposed surface/volume is much greater than that of the seams or brazes, melts before the seams.

Several factors may play a role in the reaction of the microballs in contact with the heated superfusing liquid:

the surface tensions acting locally in the environment of each microball, according to its position, namely: microball-liquid, microball-non-metallic surface, microball-metallic surface (connecting paths or solders) or others; and vertically acting forces on each microball which are predictable based on its size, its density, and the density of the superfusing liquid.

The desired behavior for one microball is either toward integration with a metallic surface of the substrate or migration toward the liquid itself, that is to say removal of this microball.

In the first case, that is to say in the case of an integration with a metallic surface, the microball spreads out on the portion of the same or similar nature if the surface of the microball and the metallic surface are not contaminated, such that the surface tension for the micro- ball-metallic surface is minimal. To obtain such a result, the metallic surface and the surfaces of the microballs should be clean. The standard of cleanliness is the absence of materials preventing the direct contact between these metallic surfaces. Examples of these materials are traces of denatured flux, and oxide films or the like. The cleaning or decontamination of these surfaces can be obtained by treatment with a product such as, for example, a liquid flux or the like. The effect of this type of product is to unite with the material contaminating these surfaces to leave the latter bare. It is to be noted that the refusion and cleaning operations may be simultaneously carried out, by the incorporation of a suitable product in the readily fusible liquid. Arbitrary metallic pathways, that is to say, apart from functional connections of the circuit, may be effected on the printed substrate, so as to trap a portion of the sufficiently proximate and agitated microballs.

In the second case, that is to say in the case of migration toward the liquid, the microball is removed and entirely surrounded by the superfusing liquid. Specifically, the critical factor in this case is the force acting vertically on the microball. The resultant force acting vertically must act in the direction of removing the microballs from the surface. For this reason, because the matter of the microballs is denser than that of the liquid, the surface of the circuit board to be treated must be directed downwardly.

It is to be noted that during the washing normally practiced at the end of brazing, a large part of the microballs secured to the non-metallic surface will be removed. The rest of these microballs can be removed, as will be described, by a simple remelting while directing the known metallic surfaces carrying these microballs downwardly.

On the other hand, a simple remelting, even with the surface of the board directed downwardly, is not sufficient either to cause the microball to fall into the superfusing liquid nor to integrate it with the metallic surface. This is readily explained if it is considered that a microball secured to a metallic surface has according to its natural tendency a tentative integration with the metallic surface. This integration is not achieved by the condition of the surface, or of the microball, r of the metallic surface or of two surfaces. Therefore, simple melting cannot make it fall, because its attachment to the metallic surface is stronger than the force of gravity drawing it downward.

In the process that has just been described, there was described a brazing of surface components on a printed substrate such as a circuit board. It goes without saying that the brazing may be effected on any support, either for surface components or for other elements to be brazed in the same manner The apparatus for brazing according to the invention may be formed as an assembly line. The printed circuit boards (6) are mounted on a transport means (11) as for example a conveyor belt. On these substrates, the brazing cream is first applied, and also the surface components are positioned. The brazing operation itself may be effected with the aid of heat sources as for example infrared emitters (12). These emitters may be positioned near the transport means (11) and covered by an insulating tunnel (13) to guard against heat loss.

At the exit of the brazing tunnel the printed substrates are cooled in a cooling chamber (14) with the aid, for example, of fans (15) which renew the air above these substrates.

The printed substrates advance for washing and rinsing: first in a washing chamber (16) then in a rinsing chamber (17). The washing chamber comprises a tank (18) provided with an overflow valve (19). Several nozzles (20) eject water or another suitable solvent on the substrates which advance on a transport means (5), a dispensing container (21) distributes a detergent at a suitable rate onto the substrates, rotary brushes (22) act on the upper surfaces of the substrates where the components are connected. A pump (23) may be used to supply the nozzles (20). A protective cover (24) covers the tank (18) without touching the substrates (6). An optional heating unit (43) may be used to heat the washing tank. The rinsing chamber (17) is provided with nozzles (25) which eject water or an appropriate solvent onto the printed substrates. The substrates, starting from the entrance (A), or starting from the exit of the chamber (14), are maintained on the transport means by members not shown The transport means (5) advances vertically downward from the exit of the chamber (17), and then is redirected to be once again horizontal, with the surfaces of the printed substrates directed downwardly.

A drying chamber (28) is disposed on the vertical portion of the passage of the transport means (5). This drying chamber (28) comprises nozzles (29) which blow air onto the surfaces of the substrates in order to dry them, and a protective cover (30) provided with an upper outlet pipe (31).

At the beginning of the horizontal portion of the transport means (5), there is disposed a chamber (26) for application of liquid flux onto the surfaces of the printed substrates. This chamber is constituted by a flux tank (32) provided with a means (27) creating waves in the flux. This means (27) comprises a nozzle (33) and a pump (34). The pump (34) impels the flux such that it spouts through the nozzle on the surface of the liquid, thus forming the waves. A filter (35) may intercept the closed flux circuit to intercept possible microballs, which become detached during the application of the flux, from the surfaces of the circuit boards. Following the chamber (26) is a preheating chamber (10) provided with heating elements (36).

Following the chamber (10) is a melting chamber (37). This chamber is constituted by a tank (1) filled with a superfusing liquid (4) and provided with heating means (40) and a means (2) for generating waves (3) in the said liquid. The means (2) may be constituted by a pump (44) and a nozzle (45), the pump (44) sucking the superfusing liquid through a conduit (9) from the tank (1) so as to impel it through the nozzle (45), the spouting liquid on the liquid surface in the tank (91) thus forming the waves (3). A filter (8) may intercept the closed liquid circuit to retain detached microballs.

It is to be noted that the waves (3) produced by the means (2) have only the role of placing in contact the readily fusible liquid (4) with the circuit board whose surface is directed downwardly. These waves should not have a resultant of force parallel to the surface of the board sufficient to displace the surface components once these brazes are softened. Contact may be effectuated by simple immersion of the board in the superfusing liquid. The choice of the placing the liquid in contact with the board by means of waves is retained solely so that the transport means (5) will not descend into the tank (1).

It is also to be noted that the functions fulfilled by the compartments (26) and (37) of application of liquid flux and fusion may be fulfilled by the fusion compartment (37). The latter is in this case the designated compartment of decontamination and fusion. The superfusing liquid incorporates products to decontaminate the metallic surfaces, namely those of the circuit board and those of the microballs.

At the exit of the melting chamber (37) is a cooling chamber (7) identical to the chamber (14).

A drain (38) is disposed beneath the path of the printed substrates at the level of the chamber (7), to receive droppings falling from the substrates or from the transport means and to conduct them back to the tank (1). This drain may be provided with a nozzle (39), the outlet of which is of a width greater than or equal to that of the printed substrates. This nozzle blows air under pressure, and is inclined with respect to the passage plane of the transport means and opposed to its direction of advancement.

At the outlet of the cooling chamber (7) is a rinsing chamber (41) identical in design to that of the chamber (17). The nozzles of the chamber (41) eject a solvent to remove the rest of the superfusing liquid, which solvent may be water if desired.

Finally, a drying chamber (42) is disposed at the end of the brazing assembly line. The design of the chamber (42) is similar to that of the chamber (28).

At the exit (B) of the brazing assembly line, means (not shown) are provided for freeing the printed substrates from the transport means (5).

It is to be noted that the brazing apparatus that has just been described is given purely by way of example. The transport means (11) and (5) may be replaced by other known means, application of the liquid flux may similarly be effected in several ways, and the cooling and washing and drying means may also be replaced by other known means.

It goes without saying that other apparatus may be constructed to practice the process claimed in the present application without departing whatsoever from the scope of the inventive concepts set forth above.

What is claimed is:

1. In a method for brazing surface components onto a circuit board including the steps of applying a brazing cream comprising microballs of brazing alloy bound by a flux to define a pasty consistency to locations on the board where brazing is to be effectuated, positioning the surface components on the board, increasing the temperature of the board to a temperature higher than the melting temperature of the brazing alloy, and cooling the circuit board to solidify the brazes, the improvement which comprises treating the board to decontaminate the surfaces of the board and the microballs to eliminate the microballs formed during brazing, said treating steps including (a) contacting the board with a superfusing liquid, the surface of the board bearing the components being directed downwardly.

(b) raising the temperature of the liquid higher than the melting point of the brazing alloy comprising the brazes and the microballs to be eliminated;

(c) controlling the liquid contact time to completely melt the microballs and to superficially melt the brazes while eliminating forces within the superfusing liquid parallel to the surface of the board sufficient to displace the components when the brazes are melted.

2. A method as defined in claim 1, wherein the decontamination of the surface of the circuit board and the surfaces of the microballs and the total remelting of the microballs and superficial remelting of the brazes are simultaneously effected by the incorporation of a decontaminating product in the superfusing liquid.

3. A method as defined in claim 1, wherein the circuit board is provided with nominal areas offering supplemental metallic surfaces, thereby facilitating the integration of certain microballs into the metallic portions.

4. Apparatus for decontaminating the component surface of a brazed circuit board to eliminate excess microballs formed during the brazing process, comprising (a) means (5) for transporting the circuit board with the surface bearing the components brazed thereto being directed downwardly;

(b) means for applying a liquid flux to the downwardly directed surfaces of the circuit board to decontaminate the surface of the board and the surfaces of the microballs contained in the brazing alloy; and (c) means for applying a superfusing liquid to said surfaces, said superfusing liquid being heated to a temperature higher than that of the brazing alloy to completely melt the microballs and superficially melt the brazes, whereby the excess microballs are removed from the surface of the circuit board.

5. Apparatus as defined in claim 4, wherein said liquid flux applying means and said superfusing applying means comprise separate compartments.

6. Apparatus as defined in claim 5, wherein said compartments include means for generating waves of liquid flux and superfusing liquid, respectively, said waves having no resultant forces parallel to the surface being treated.

* * * * *